United States Patent
Otani et al.

(10) Patent No.: US 6,441,299 B2
(45) Date of Patent: Aug. 27, 2002

(54) COVERING MEMBER FOR SOLAR BATTERY

(75) Inventors: Kaoru Otani; Yasuhiro Iino; Kazuya Takano, all of Kanagawa (JP)

(73) Assignee: Bridgestone Corporation, Tokyo (JP)

( * ) Notice: Subject to any disclaimer, the term of this patent is extended or adjusted under 35 U.S.C. 154(b) by 0 days.

(21) Appl. No.: 09/800,526

(22) Filed: Mar. 8, 2001

Related U.S. Application Data (63) Continuation of application No. PCT/JP99/06725, filed on Dec. 1, 1999.

(30) Foreign Application Priority Data

| Dec. 7, 1998 | (JP) | 10-347224 |
| Dec. 7, 1998 | (JP) | 10-347225 |
| Dec. 7, 1998 | (JP) | 10-347226 |
| Dec. 7, 1998 | (JP) | 10-347227 |

(51) Int. Cl.[7] ............ H01L 31/048; H01L 31/042; B32B 27/36
(52) U.S. Cl. ........... 136/251; 136/244; 136/256; 428/421; 428/426; 428/430; 428/441; 428/500; 428/701; 428/451
(58) Field of Search ............... 136/251, 244, 136/256; 428/421, 426, 430, 441, 500, 701, 451

(56) References Cited

U.S. PATENT DOCUMENTS 5,650,019 A * 7/1997 Yamada et al. ............. 136/251
6,335,479 B1 * 1/2002 Yamada et al. ............. 136/251

FOREIGN PATENT DOCUMENTS

| EP | 0 680 096 | 4/1995 |
| EP | 0 775 080 | 7/1996 |
| JP | 60-201652 | 10/1985 |
| JP | 60-201652 A | * 10/1985 |
| JP | 6-318728 | 11/1994 |
| JP | 6-318728 A | * 11/1994 |
| JP | 9-199740 A | * 7/1997 |
| JP | 10-25357 A | * 1/1998 |
| JP | 10-308521 A | * 11/1998 |
| WO | 95/09442 | 4/1995 |

* cited by examiner

Primary Examiner—Alan Diamond
(74) Attorney, Agent, or Firm—Kanesaka & Takeuchi (57) ABSTRACT

A covering member is used as a transparent protective member for protecting solar cells of a solar battery. The covering member includes a transparent high-sunproof film, a transparent high-moistureproof film laminated on the transparent high-sunproof film, and ethylene-vinyl acetate copolymer adhesive disposed between the transparent high-sunproof film and the transparent high-moistureproof film. The high-moistureproof film is formed of two transparent polyethylene terephthalate films and inorganic oxide coatings coated on the respective films. The inorganic oxide coatings are formed of silica and/or alumina, and coating surfaces thereof are bonded to each other. The ethylene-vinyl acetate copolymer adhesive contains ultraviolet absorbing agent and organic peroxide as a cross-linking agent.

4 Claims, 6 Drawing Sheets

COVERING MEMBER FOR SOLAR BATTERY

CROSS REFERENCE TO RELATED APPLICATION

This is a continuation application of PCT/JP99/06725 filed on Dec. 1, 1999.

FIELD OF THE INVENTION

The present invention relates to a covering member to be used as a transparent protective member for protecting solar cells of a solar battery. More particularly, the present invention relates to a covering member for solar battery, which is made of transparent films having moistureproof property and sunproof property to improve the impact resistance and durability of the solar battery.

BACKGROUND OF THE INVENTION

In recent years, solar cells which directly convert sunlight to electric energy have been drawing the attention of people in view of effective utilization of natural materials and prevention of environmental pollution, and thus been developed.

Figure 17:
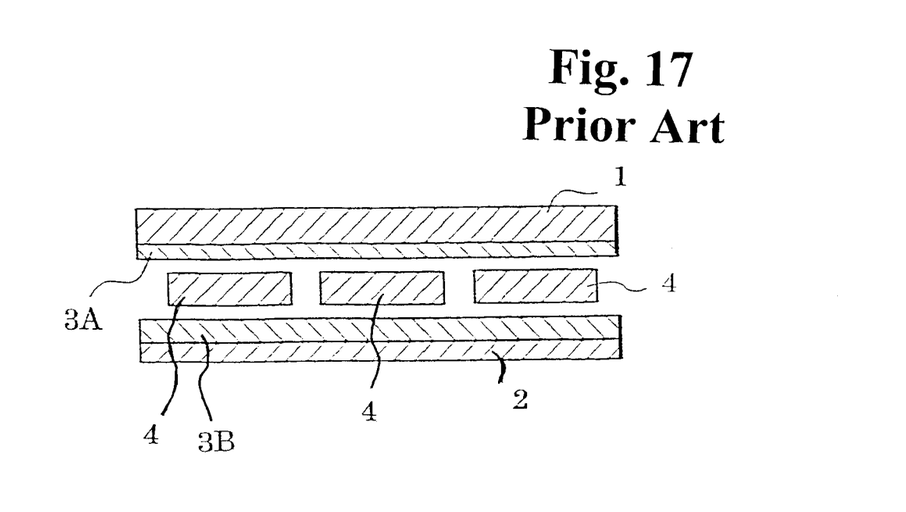
FIG. 17 is a sectional view showing a conventional solar battery.

A typical solar battery comprises, as shown in FIG. 17, a glass substrate 1 as a front side transparent protective member at a light-receiving side, a back side protective member (backside covering member) 2, ethylene-vinyl acetate copolymer (EVA) films 3A, 3B as sealing films arranged between the glass substrate 1 and the back side protective member 2, and solar cells or silicon photovoltaic elements 4 sealed by the EVA films 3A, 3B.

To manufacture this solar battery, the glass substrate 1, the sealing EVA film 3A, silicone photovoltaic elements 4, the sealing EVA film 3B and the backside covering member 2 are successively overlaid in this order and integrated together by fusing and crosslinking the EVA.

By the way, excellent durability against ultraviolet radiation is a prime requirement in front side transparent protective members for solar batteries. In addition, excellent moistureproof property is also a primary requirement in order to prevent inside wirings or electrodes from corroding due to moisture or water permeation. Accordingly, the glass plates are conventionally used as front side transparent protective members.

Though a glass plate has excellent sunproof property and moistureproof property, it also has heavy weight and poor impact strength so that it is easily broken.

If using a transparent resin film, no problem should arise in the weight and impact strength, However, there is no conventional resin film excellent in both sunproof property and moistureproof property. That is, though a fluororesin film made of 2-ethylene-4-fluoroethylene-copolymer (ETFE) or the like is known as a transparent resin film having excellent sunproof property, it has moisture permeability so that it is not suitable as the front side transparent protective member for solar batteries.

DISCLOSURE OF THE INVENTION

It is an object of the present invention to provide a covering member for solar battery and a sealing film having a function as a covering member for solar battery each of which can be used as a transparent protective member for solar cells of a solar battery, wherein said covering member and said sealing film are made of transparent films having moistureproof property and sunproof property so as to be effective for lightening the solar battery and improving the impact resistance and durability of the solar battery. It is another object of the present invention to provide a light-weight, high impact resistant, high durable solar battery using the aforementioned covering member as front side and/or back side protective members.

A covering member for solar battery according to a first aspect of the present invention is a covering member to be used as a transparent protective member for protecting solar cells of a solar battery, comprising: a transparent high-moistureproof film and a transparent high-sunproof film having excellent durability against ultraviolet radiation, wherein the transparent high-moistureproof film and the transparent high-sunproof film are integrally laminated to each other.

Since the covering member for solar battery is made by integrally laminating the transparent high-moisture proof film and the transparent high-sunproof film, the covering member has enough moistureproof property and sunproof property required as a transparent protective member for solar battery.

A covering member for solar battery according to a second aspect of the present invention is a covering member to be used as a transparent protective member for protecting solar cells of a solar battery, comprising: a transparent high-sunproof film and a transparent high-moistureproof film, wherein the transparent high-sunproof film and the transparent high-moistureproof film are integrally laminated with adhesive containing ultraviolet absorbing agent.

According to this covering member for solar battery, the moistureproof property required as a transparent protective member for solar battery can be ensured by the transparent high-moistureproof film, and the sunproof property can be ensured by the transparent high-sunproof film and the ultraviolet absorbing agent in the adhesive.

A covering member for solar battery according to a third aspect of the present invention is a covering member to be used as a transparent protective member for protecting solar cells of a solar battery, comprising: a transparent high-sunproof film and a transparent high-moistureproof film, wherein the transparent high-sunproof film and the transparent high-moistureproof film are integrally laminated with EVA resin adhesive containing ultraviolet absorbing agent and cross-linking agent.

According to this covering member for solar battery, the moistureproof property required as a transparent protective member for solar battery can be ensured by the transparent high-moistureproof film, and the sunproof property can be ensured by the transparent high-sunproof film and the ultraviolet absorbing agent in the EVA resin adhesive. In addition, the EVA resin adhesive itself has high moistureproof property and is excellent in weatherability when containing cross-linking agent. Therefore, the EVA resin adhesive is effective for improving properties of the covering member. The cross-linking agent to be mixed in the EVA resin adhesive may be organic peroxide.

A covering member for solar battery according to a fourth aspect of the present invention is a covering member to be used as a transparent protective member for protecting solar cells of a solar battery, comprising a high-sunproof and high-moistureproof film made by coating inorganic oxide on a surface of a transparent base film containing ultraviolet absorbing agent.

According to this covering member for solar battery, the moistureproof property required as a transparent protective member for solar battery can be ensured by a coating layer made of inorganic oxide, and the sunproof property can be ensured by the ultraviolet absorbing agent contained in the transparent base film.

A sealing film having a function as a covering member of the present invention is a sealing film having a function as a transparent protective member for protecting solar cells of a solar battery, comprising: any one of the aforementioned covering members for solar battery of the invention and an EVA film, wherein the covering member and the EVA film are integrally laminated to each other.

A solar battery of the present invention is a solar battery comprising: a front side protective member; a back side protective member; and solar cells which are sealed between the front side protective member and the back side protective member, wherein at least one of the front side protective member and the back side protective member is any one of the aforementioned covering members of the present invention.

DETAILED DESCRIPTION OF THE PREFERRED EMBODIMENTS

Hereinafter, embodiments of the present invention will be described with reference to the attached drawings.

Though covering members for solar battery of the present invention will be described taking a case of being used as front side transparent protective members in the following description, the covering members for solar battery of the present invention can be used as back side transparent protective members and also can be used as both of front side transparent protective members and back side transparent protective members.

First, description will now be made as regard to a covering member for solar battery according to the first aspect of the present invention.

Figure 1:
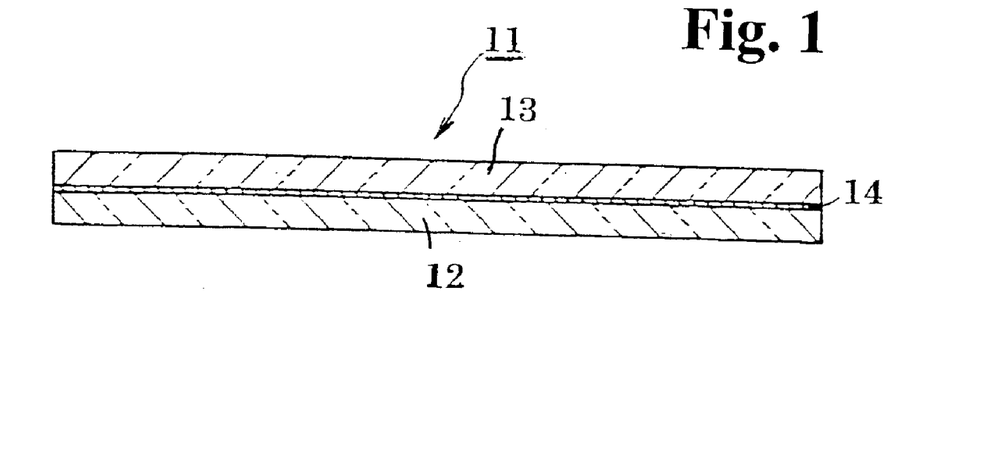
FIG. 1 is a sectional view showing an embodiment of a covering member for solar battery according to a first aspect of the present invention.
Figure 2:
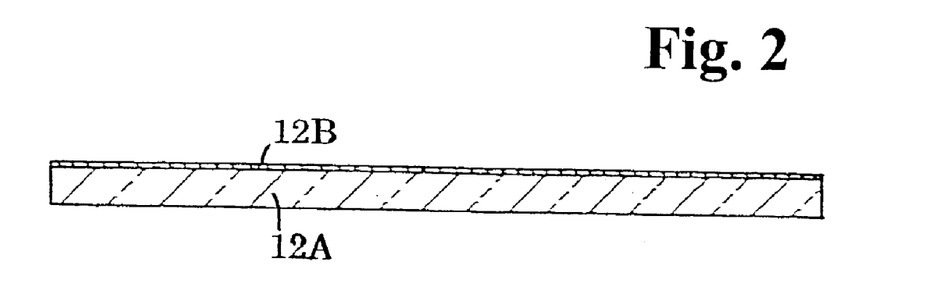
FIG. 2 is a sectional view showing an embodiment of a transparent high-moistureproof film according to the first aspect.
Figure 3:
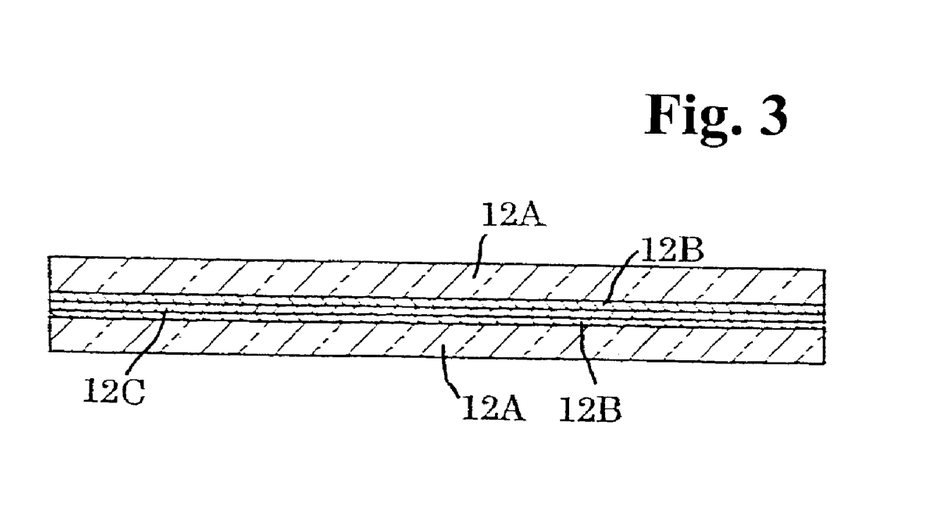
FIG. 3 is a sectional view showing another embodiment of the transparent high-moistureproof film according to the first aspect.
Figure 4:
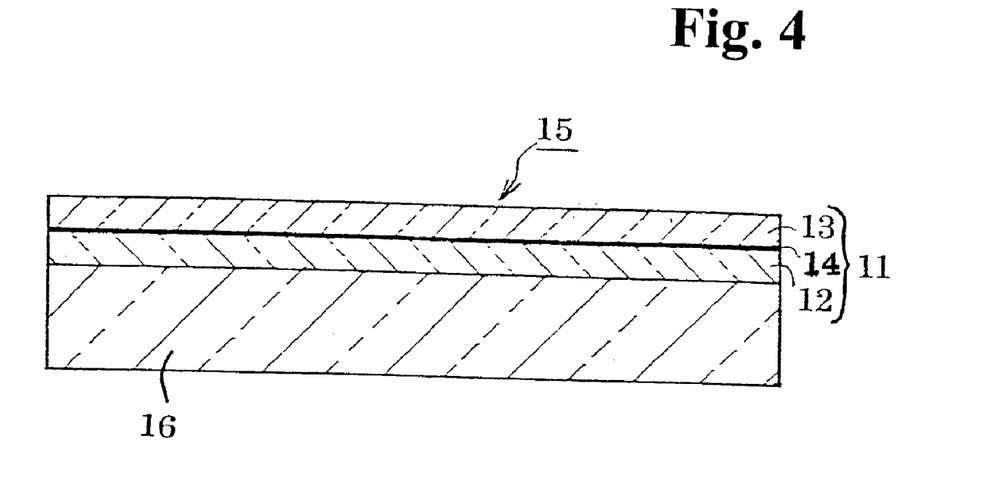
FIG. 4 is a sectional view showing an embodiment of a sealing film of the present invention using the covering member shown in FIG. 1.
Figure 5:
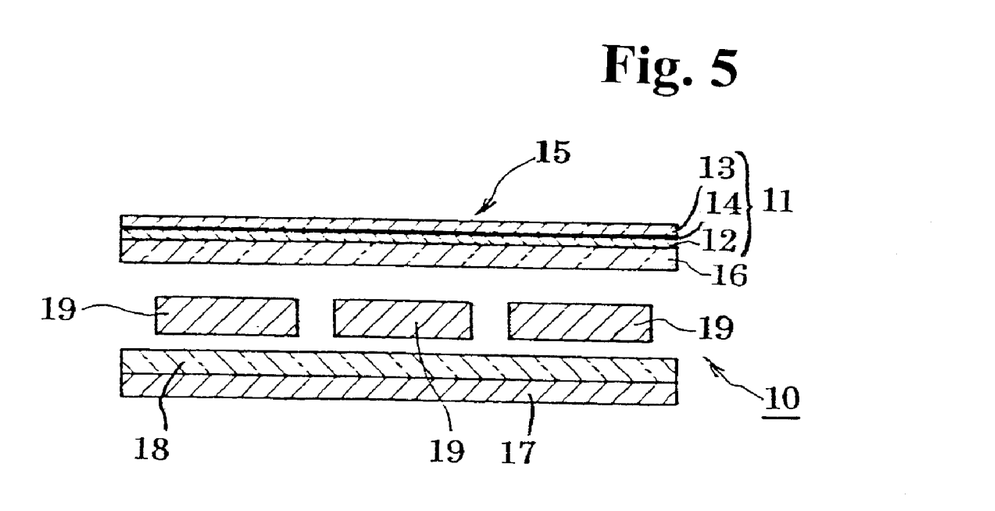
FIG. 5 is a sectional view showing an embodiment of a solar battery of the present invention using the covering member shown in FIG. 1.

FIG. 1 is a sectional view of an embodiment of the covering member for solar battery according to the first aspect of the present invention, FIGS. 2 and 3 are sectional views showing embodiments of a transparent high-moistureproof film according to the first aspect, FIG. 4 is a sectional view showing a sealing film having a function as a covering member (hereinafter, referred to as "covering/sealing film) for solar battery of the present invention using the covering member shown in FIG. 1, and FIG. 5 is a sectional view showing an embodiment of a solar battery of the present invention using the covering member shown in FIG. 1.

The covering member 11 shown in FIG. 1 is constituted of a transparent high-moistureproof film 12 and a transparent high-sunproof film 13 which are integrally laminated to each other via an adhesive sheet 14.

The transparent high-moistureproof film 12 is, as shown in FIG. 2, preferably constituted of a transparent base film 12A which is made of a polyethylene terephthalate (PET) film or the like and a moistureproof layer 12B which is formed by depositing inorganic oxide such as silica and alumina on the base film 12A by CVD (Chemical Vapor Deposition) method, PVD (Physical Vapor Deposition) method or the like. Generally known as moistureproof film is a film having a coating layer of metal such as aluminum on a base film. However, when metal such as aluminum is applied to a solar battery, there is a possibility of current leakage. Accordingly, a coating layer of inorganic oxide is preferably used as a moistureproof layer.

As shown in FIG. 2, the moistureproof layer 12B made of inorganic oxide such as silica and alumina formed on the surface of the base film 12A is easily separated in service. Therefore, the transparent high-moistureproof film 12 is preferably formed by using two films, on each of which a moistureproof layer 12B made of inorganic oxide such as silica and alumina is formed, and laminating the two films via an adhesive sheet 12C in a state that the moistureproof layers 12B, 12B face each other as shown in FIG. 3 so that the moistureproof layers 12B are not exposed to outside. The adhesive sheet 12C may be made of the same material as that of the adhesive sheet 14, described later, used for bonding the transparent high-moistureproof film 12 and the transparent high-sunproof film 13, and thus can be used the same bonding condition as the adhesive sheet 14 as described later.

Suitably used as the base film 12A for the transparent high-moistureproof film as shown in FIG. 3 is a PET film having a thickness of 6–250 μm, and the moistureproof layer 12B is preferably formed to have a thickness of 5 μm or less. The thickness of the adhesive sheet 12C is preferably in a range from 5 μm to 50 μm.

As examples of the transparent high-sunproof film 13, a fluororesin film having excellent ultraviolet resistance and a resin film in which ultraviolet absorbing agent is mixed are taken.

Specific examples of fluororesin for the fluororesin film are polytetrafluoroethylene (PTFE), 4-fluoroethylene-perchloroalkoxy-copolymer (PFA), 4-fluoroethylene-6-fluoropropylene-copolymer (FEP), 2-ethylene-4-fluoroethylene-copolymer (ETFE), polychlorotrifluoroethylene (PCTFE), polyvinylidene fluoride (PVDF), and polyvinyl fluoride (PVF).

Examples of the resin film in which ultraviolet absorbing agent is mixed include an acrylic film, a polycarbonate film, a PET film, and a polyethyleneaphthalate (PEN) film. The ultraviolet absorbing agent thereof is exemplified by benzophenone series compounds including 2-hydroxy-4-octoxybenzophenone and 2-hydroxy- methoxy-5-sulfobenzophenone, benzotriazole series compounds including 2-(2'-hydroxy-5-methylphenyl) benzotriazole, and hindered amine series compounds including phenyl salicylate and p-t-butylphenyl salicylate. Normally, the ultraviolet absorbing agent in added in an amount of 1–20 wt. % relative to the base resin.

The thickness of the transparent high-sunproof film 13 is preferably in a range between 12 μm and 200 μm.

The covering member 11 for solar battery of the present invention can be easily manufactured by interposing the adhesive sheet 14 between the aforementioned transparent high-moistureproof film 12 and the transparent high-sunproof film 13, and heating and pressing them under the bonding condition of the adhesive sheet 14 to laminate them integrally.

Suitably employed as the adhesive sheet 14 to be used herein is an EVA film as described later generally used for solar battery, and the thickness of the EVA film is preferably in a range between 5 μm and 50 μm.

In the covering member of the present invention, it is preferable that the transparent high-sunproof film 13 is disposed at the surface side and the transparent high-moistureproof film 12 is disposed inside.

To manufacture the solar battery of the present invention using the covering member for solar battery as mentioned above, the covering member of the present invention is used for sealing solar cells, instead of the conventional glass plate for solar battery shown in FIG. 17. It is preferable that the covering member of the present invention is previously integrally laminated to a sealing EVA film.

As shown in FIG. 4, the covering/sealing film 15 of the present invention comprises a covering member 11 or the present invention, which is made by integrally laminating a transparent high-moistureproof film 12 and a transparent high-sunproof film 13, and an EVA film 16 integrally laminated to a surface of the covering member 11.

The covering/sealing film 15 for solar battery can be easily manufactured by integrally laminating the covering member 11 of the present invention, which is previously made by integrally bonding the transparent high-moistureproof film 12 and the transparent high-sunproof film 13, onto the EVA film 16 in forming the EVA film 16. In this case, the temperature for laminating is suitably in a range from 75° C. to 90° C.

The thickness of the EVA film 16 is preferably in a range from 0.1 mm to 1 mm.

The solar battery 10 of the present invention can be easily manufactured by integrally laminating the covering/sealing film 15 for solar battery onto a backside covering member 17, an EVA film 18, and solar cells such as silicon photovoltaic elements 19 together as shown in FIG. 5 according to the normal method, i.e. by heating, deaerating, and pressing the stack with a vacuum laminator at a temperature of 120–150° C., with a time period for deaerating 2–15 minutes, at a pressure of 0.5–1 atm, and a time period for pressing 8–45 minutes.

Hereinafter, description will now be made as regard to a covering member for solar battery according to the second aspect of the present invention.

Figure 6:
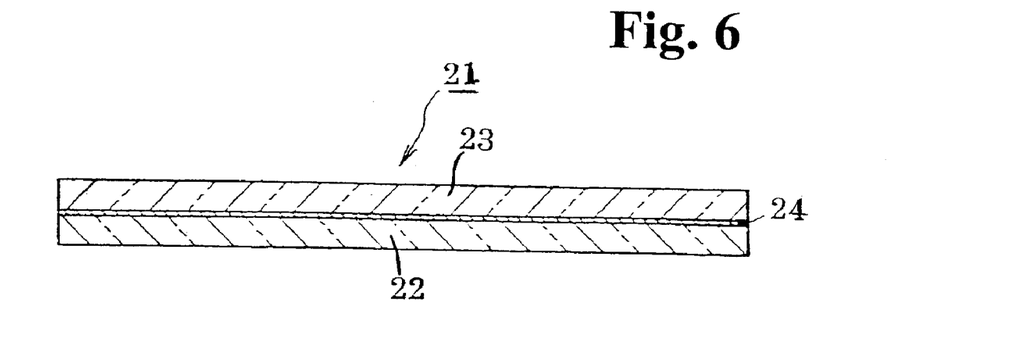
FIG. 6 is a sectional view showing an embodiment of a covering member for solar battery according to a second aspect of the present invention.
Figure 7:
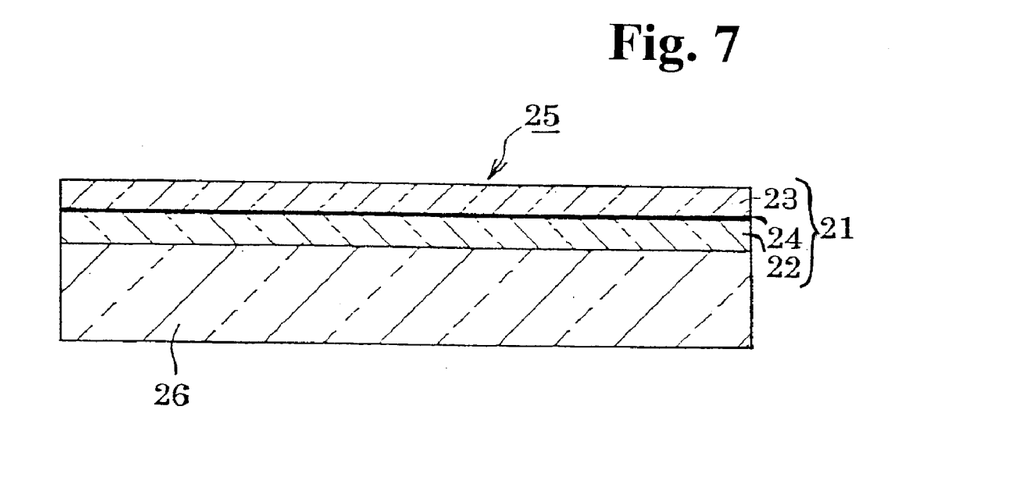
FIG. 7 is a sectional view showing an embodiment of a sealing film of the present invention using the covering member shown in FIG. 6.
Figure 8:
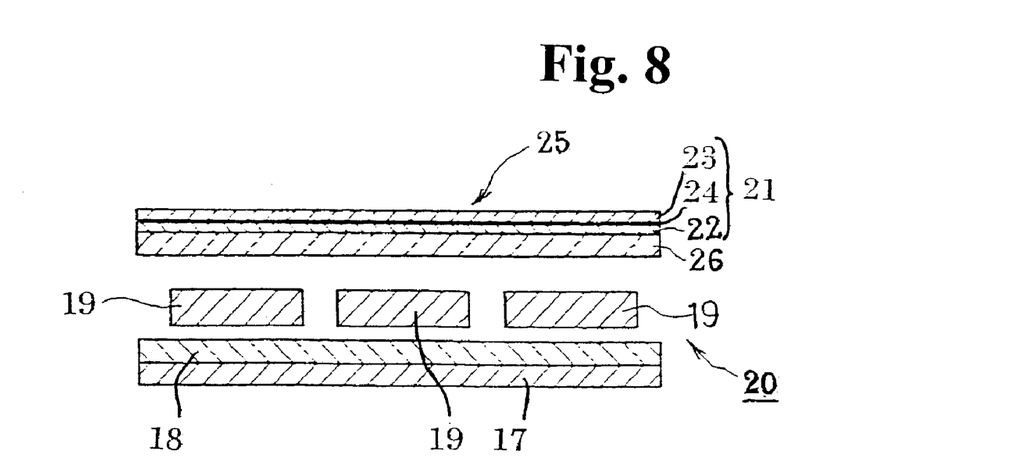
FIG. 8 is a sectional view showing an embodiment of a solar battery of the present invention using the covering member shown in FIG. 6.

FIG. 6 is a sectional view of an embodiment of the covering member for solar battery according to the second aspect of the present invention, FIG. 7 is a sectional view showing a covering/sealing film for solar battery of the present invention using the covering member shown in FIG. 6, and FIG. 8 is a sectional view showing an embodiment of a solar battery of the present invention using the covering member shown in FIG. 6.

The covering member 21 shown in FIG. 6 is constituted of a transparent high-moistureproof film 22 and a transparent high-sunproof film 23 which are integrally laminated to each other via an adhesive sheet 24 in which ultraviolet absorbing agent is mixed (hereinafter, referred to as "ultraviolet absorbing adhesive sheet 24").

The transparent high-moistureproof film 22 is just like that of the first aspect, that is, as shown in FIG. 2, preferably constituted of a transparent base film 12A such as PET film and a moistureproof layer 12B which is formed by depositing inorganic oxide such as silica and alumina on the base film 12A by CVD (Chemical Vapor Deposition) method, PVD (Physical Vapor Deposition ) method, or, as shown in FIG. 3, preferably formed by using two base films 12A such as PET films, on each of which a moistureproof layer 12B made of inorganic oxide such as silica and alumina is formed, and laminating the two base films via an adhesive sheet 12C in a state that the moistureproof layers 12B, 12B face each other so that the mositureproof layers 12B are not exposed to outside. The adhesive sheet 12C may be made of the same material as that of the ultraviolet absorbing adhesive sheet 24, described later, used for bonding the transparent high-moistureproof film 22 and the transparent high-sunproof film 23 (it should be noted that the adhesive sheet 12C may not contain, but preferably contain the ultraviolet absorbing agent), and thus can be applied under the same bonding condition as the ultraviolet absorbing adhesive sheet 24 as described later.

As examples of the transparent high-sunproof film 23, a fluororesin film having excellent ultraviolet resistance and a resin film in which ultraviolet absorbing agent is mixed are taken just like the first aspect.

The ultraviolet absorbing adhesive sheet 24 may be made of an adhesive resin such as epoxy resin, acrylic resin, urethane resin, or ester resin wherein the adhesive resin is formed into a sheet after mixed with the ultraviolet absorbing agent. The ultraviolet absorbing agent thereof is exemplified by benzophenone series compounds including 2-hydroxy-4-octoxybenzophenone and 2-hydroxy-methoxy-5-sulfobenzophenone, benzotriazole series compounds including 2-(2'-hydroxy-5-methylphenyl)benzotriazole, and hindered amine series compounds including phenyl salicylate and p-t-butylphenyl salicylate. Normally, the ultraviolet absorbing agent is added in an amount of 1–50 wt. % relative to the base resin. The thickness of the ultraviolet absorbing adhesive sheet 24 is preferably in a range from 5 µm to 50 µm.

The covering member 21 for solar battery of the present invention can be easily manufactured by interposing the ultraviolet absorbing adhesive sheet 24 between the aforementioned transparent high-moistureproof film 22 and the transparent high-sunproof film 23, and heating and pressing them under the bonding condition of the ultraviolet absorbing adhesive sheet 24 to laminate them integrally.

In the covering member of the present invention, it is preferable that the transparent high-sunproof film 23 is disposed at the surface side and the transparent high-moistureproof film 22 is disposed inside.

To manufacture the solar battery of the present invention using the covering member for solar battery as mentioned above, the covering member of the present invention is used for sealing solar cells, instead of the conventional glass plate for solar battery shown in FIG. 17. It is preferable that the covering member of the present invention is previously integrally laminated to a sealing EVA film.

As shown in FIG. 7, the covering/sealing film 25 of the present invention comprises a covering member 21 of the present invention, which is made by integrally laminating a transparent high-moistureproof film 22 and a transparent high-sunproof film 23 with the ultraviolet absorbing adhesive agent, and an EVA film 26 integrally laminated to a surface of the covering member 21.

The covering/sealing film 25 for solar battery can be easily manufactured by integrally laminating the covering member 21 of the present invention, which is previously made by integrally bonding the transparent high-moistureproof film 22 and the transparent high-sunproof film 23, onto the EVA film 26 in forming the EVA film 26. In this case, the temperature for laminating is suitably in a range from 75° C. to 90° C.

The thickness of the EVA film 26 is preferably in a range from 0.1 mm to 1 mm.

The solar battery 20 of the present invention can be easily manufactured by integrally laminating the covering/sealing film 25 for solar battery onto a backside covering member 17, an EVA film 18, and solar cells such as silicon photovoltaic elements 19 together as shown in FIG. 8 according to the normal method, i.e. by deaerating, pressing, and heating the stack with a vacuum laminator at a temperature of 120–150° C., with a time period for deaerating 2–15 minutes, at a pressure of 0.5–1 atm, and a time period for pressing 8–45 minutes.

Hereinafter, description will now be made as regard to a covering member for solar battery according to the third aspect of the present invention.

Figure 9:
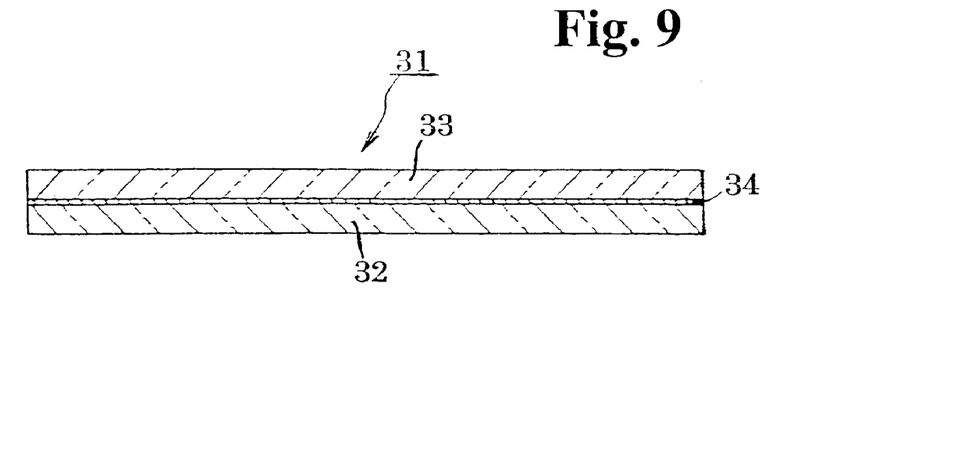
FIG. 9 is a sectional view showing an embodiment of a covering member for solar battery according to a third aspect of the present invention.
Figure 10:
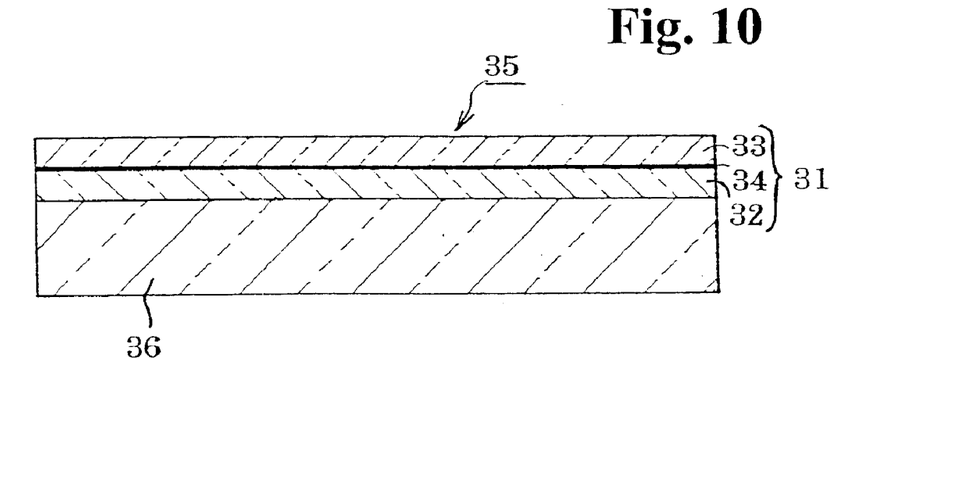
FIG. 10 is a sectional view showing an embodiment of a sealing film of the present invention using the covering member shown in FIG. 9.
Figure 11:
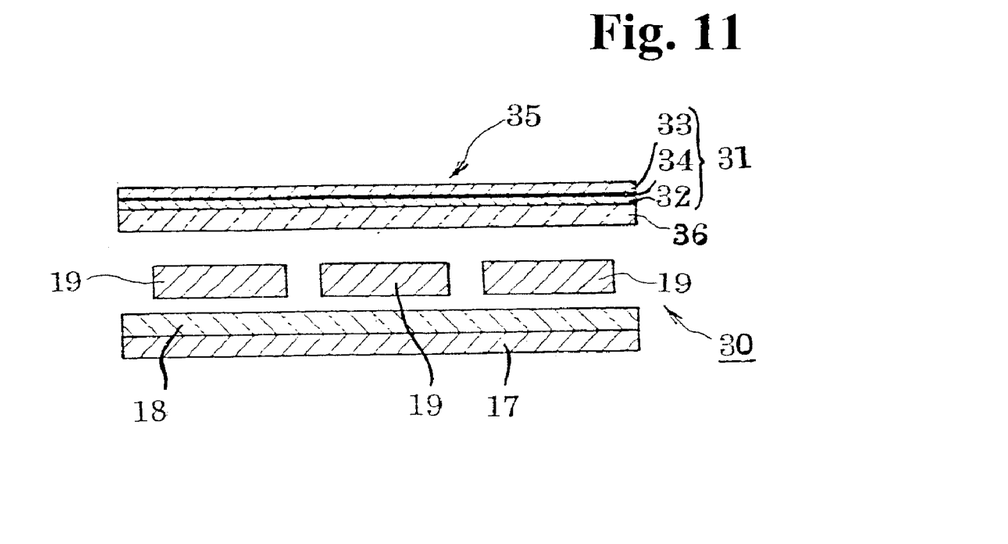
FIG. 11 is a sectional view showing an embodiment of a solar battery of the present invention using the covering member shown in FIG. 9.

FIG. 9 is a sectional view of an embodiment of the covering member for solar battery according to the third aspect of the present invention, FIG. 10 is a sectional view showing a covering/sealing film for solar battery of the present invention using the covering member shown in FIG. 9, and FIG. 11 is a sectional view showing an embodiment of a solar battery of the present invention using the covering member shown in FIG. 9.

The covering member 31 shown in FIG. 9 is constituted of a transparent high-moistureproof film 32 and a transparent high-sunproof film 33 which are integrally laminated to each other via an EVA adhesive sheet 34 in which ultraviolet absorbing agent and cross-linking agent are mixed (hereinafter, referred to as "ultraviolet absorbing EVA adhesive sheet 34").

The transparent high-moistureproof film 32 is just like that of the first aspect, that is, as shown in FIG. 2, preferably constituted of a transparent base film 12A such as PET film and a moistureproof layer 12B which is formed by depositing inorganic oxide such as silica and alumina on the base film 12A by CVD (Chemical Vapor Deposition) method, PVD (Physical Vapor Deposition) method, or, as shown in FIG. 3, preferably formed by using two base films 12A such as PET films, on each of which a moistureproof layer 12B made of inorganic oxide such as silica and alumina is formed, and laminating the two base films via an adhesive sheet 12C in a state that the moistureproof layers 12B, 12B face each other so that the moistureproof layers 12B are not exposed to outside. The adhesive sheet 12C may be made of the same material as that of the ultraviolet absorbing EVA adhesive sheet 34, described later, used for bonding the transparent high-moistureproof film 32 and the transparent high-sunproof film 33 (it should be noted that the adhesive sheet 12C may not contain the ultraviolet absorbing agent), and thus can be used under the same bonding condition as the ultraviolet absorbing EVA adhesive sheet 34 as described later.

As examples of the transparent high-sunproof film 33, a fluororesin film having excellent ultraviolet resistance or a resin film in which ultraviolet absorbing agent is mixed may be used just like the first aspect.

The ultraviolet absorbing EVA adhesive sheet 34 may be made of EVA resin wherein the EVA resin is formed into a sheet after mixed with ultraviolet absorbing agent and cross-linking agent and, if necessary, other additive thereinto.

Suitable EVA resin compositions as the material of the ultraviolet absorbing EVA adhesive sheet 34 according to the present invention will be described later.

The ultraviolet absorbing agent is added into the EVA resin composition as the material of the ultraviolet absorbing EVA adhesive sheet 34 in order to give the sunproof property to the ultraviolet absorbing EVA adhesive sheet 34. The ultraviolet absorbing agent thereof is exemplified by benzophenone series compounds including 2-hydroxy-4-octoxybenzophenone and 2-hydroxy-methoxy-5-sulfobenzophenone, benzotriazole series compounds including 2-(2'-hydroxy-5-methylphenyl)benzotriazole, and salicylate compounds including phenyl salicylate and p-t-butylphenyl salicylate. Normally, the ultraviolet absorbing agent is added in an amount of 1–50 parts by weight relative to 100 parts by weight of EVA resin.

The thickness of the ultraviolet absorbing EVA adhesive sheet 34 is preferably in a range from 5 µm to 50 µm.

The covering member 31 for solar battery of the present invention can be easily manufactured by interposing the ultraviolet absorbing EVA adhesive sheet 34 between the aforementioned transparent high-moistureproof film 32 and the transparent high-sunproof film 33, and heating and pressing them under the bonding condition of the ultraviolet absorbing EVA adhesive sheet 34 to laminate them integrally.

In the covering member of the present invention, it is preferable that the transparent high-sunproof film 33 is disposed at the surface side and the transparent high-moistureproof film 32 is disposed inside.

To manufacture the solar battery of the present invention using the covering member for solar battery as mentioned above, the covering member of the present invention is used for sealing solar cells, instead of the conventional glass plate for solar battery shown in FIG. 17. It is preferable that the covering member of the present invention is previously integrally laminated to a sealing EVA film.

As shown in FIG. 10, the covering/sealing film 35 of the present invention comprises a covering member 31 of the present invention, which is made by integrally laminating a transparent high-moistureproof film 32 and a transparent high-sunproof film 33 with EVA adhesive agent containing the ultraviolet absorbing agent and cross-linking agent, and an EVA film 36 integrally laminated to a surface of the covering member 31.

The covering/sealing film 35 for solar battery can be easily manufactured by integrally laminating the covering member 31 of the present invention, which is previously made by integrally bonding the transparent high-moistureproof film 32 and the transparent high-sunproof film 33, onto the EVA film 36 in forming the EVA film 36. In this case, the temperature for laminating is suitably in a range from 75° C. to 90° C.

The solar battery 30 of the present invention can be easily manufactured by integrally laminating the covering/sealing film 35 for solar battery onto a backside covering member 17, an EVA film 18, and solar cells such as silicon photovoltaic elements 19 together as shown in FIG. 11 according to the normal method, i.e. by deaerating, pressing, and heating the stack with a vacuum laminator at a temperature of 120–150° C., with a time period for deaerating 2–15 minutes, at a pressure of 0.5–1 atm, and a time period for pressing 8–45 minutes.

Hereinafter, description will now be made as regard to a covering member for solar battery according to the fourth aspect of the present invention.

Figure 12:
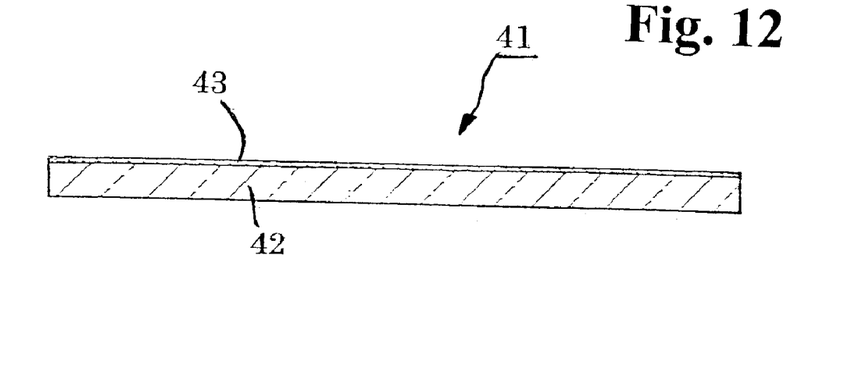
FIG. 12 is a sectional view showing an embodiment of a covering member for solar battery according to a fourth aspect of the present invention.
Figure 13:
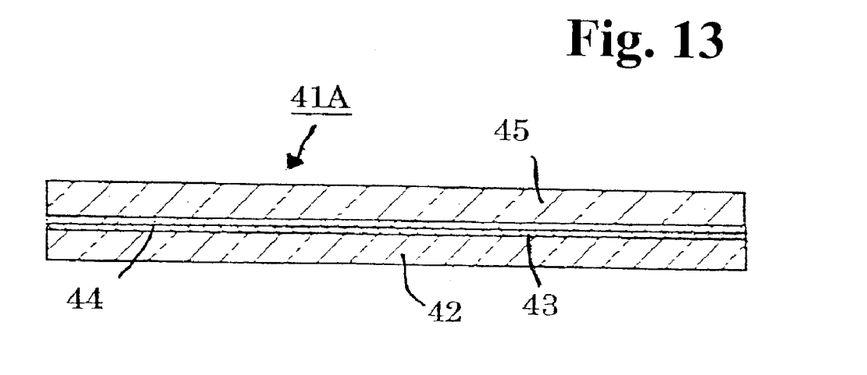
FIG. 13 is a sectional view showing another embodiment of the covering member for solar battery according to the fourth aspect of the present invention.
Figure 14:
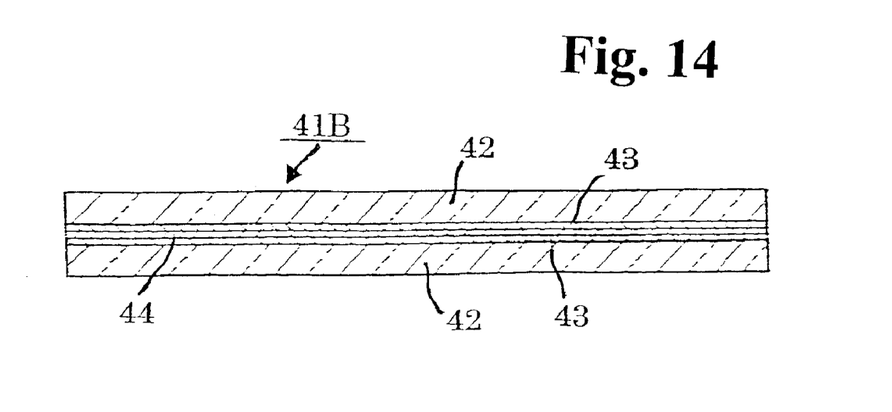
FIG. 14 is a sectional view showing further another embodiment of the covering member for solar battery according to the fourth aspect of the present invention.
Figure 15:
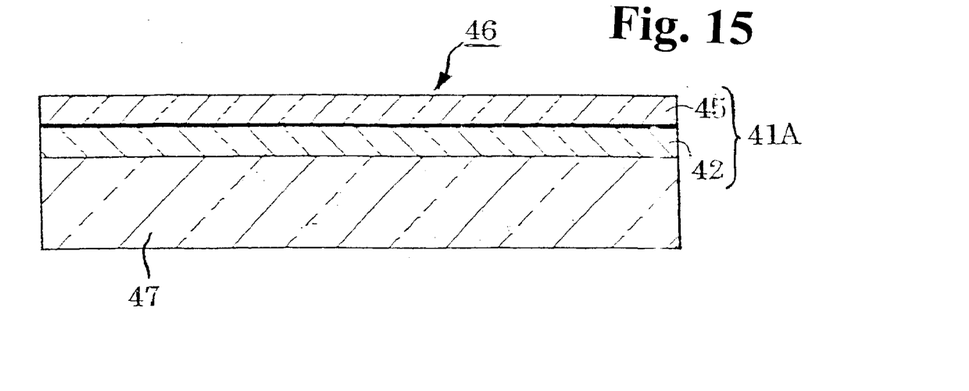
FIG. 15 is a sectional view showing an embodiment of a sealing film having a function as a covering member for solar battery of the present invention using the covering member shown in FIG. 13.
Figure 16:
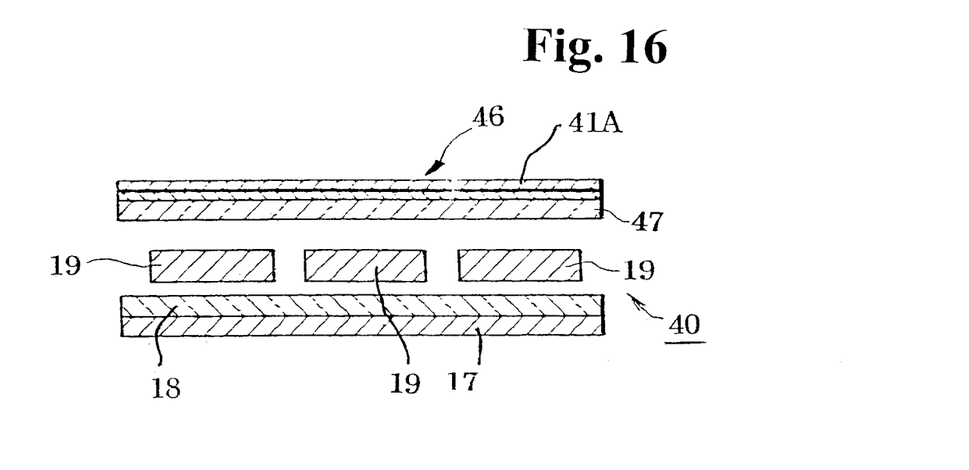
FIG. 16 is a sectional view showing an embodiment of a solar battery of the present invention using the covering member shown in FIG. 13.

FIGS. 12 through 14 are sectional view of embodiments of the covering member for solar battery according to the fourth aspect of the present invention, FIG. 15 is a sectional view showing a covering/sealing film for solar battery of the present invention using the covering member of this aspect, and FIG. 16 is a sectional view showing an embodiment of a solar battery of the present invention using the covering member of this aspect.

The covering member 41 shown in FIG. 12 is made of a high-sunproof and high-moistureproof transparent film constituted of a transparent base film 42 in which ultraviolet absorbing agent is mixed and a coating layer 43 which is formed on a surface of the transparent base film 42 by depositing inorganic oxide to form a moistureproof layer.

Examples as the base resin of the transparent base film 42 include acrylic resin, polycarbonate resin, PET resin, and PEN resin. Among them, the PET resin is preferable. The ultraviolet absorbing agent to be mixed is exemplified by benzophenone series compounds including 2-hydroxy-4-octoxybenzophenone and 2-hydroxy-methoxy-5-sulfobenzophenone, benzotriazole series compounds including 2-(2'-hydroxy-5-methylphenyl)-benzotriazole, and salicylate compounds including phenyl salicylate and p-t-butylphenyl salicylate. Normally, the ultraviolet absorbing agent is added in an amount of 1–20 wt. % relative to the base resin.

The thickness of the transparent base film 42 is preferably in a range from 12 $\mu$m to 200 $\mu$m.

Examples as the inorganic oxide used to form the moistureproof layer include silica and alumina. The coating layer of this inorganic oxide can be formed by CVD (Chemical Vapor Deposition) method, PVD (Physical Vapor Deposition) method or the like, and the thickness of the this layer is preferably in a range from 5 $\mu$m to 50 $\mu$m.

As mentioned above, the coating layer 43 made of inorganic oxide such a silica and alumina formed on the surface of the transparent base film 42 is easily separated when handled. Therefore, the covering member of the present invention is preferably composed of a covering member 41A formed by laminating a transparent protective film 45 on the coating layer 43 of inorganic oxide formed on the transparent base film 42 with an adhesive sheet 44, or a covering member 41B formed by using two transparent base films 42 such as the aforementioned PET films, on each of which a coating layer 43 made of inorganic oxide such as silica and alumina is formed, and laminating the two transparent base films 42 with an adhesive sheet 44 in a state that the coating layers 43, 43 face each other so that the coating layers 43 are not exposed to outside. The adhesive sheet 44 may be an EVA film, described later, generally used for manufacturing solar batteries, and thus can be used under the same bonding condition as the EVA film.

Examples as the transparent protective film 45 include acrylic film, polycarbonate film, PET film, and PEN film. Among them, the PET is preferable. Ultraviolet absorbing agent may be added also in the transparent protective film 45. The thickness of the transparent protective film 45 is preferably in a range from 6 $\mu$m to 200 $\mu$m. The thickness of the adhesive sheet 44 is preferably in a range from 5 $\mu$m to 50 $\mu$m.

In case that the covering member is not laminated as shown in FIGS. 13 and 14 and the coating layer 43 is exposed to outside, it is preferable that the transparent base film 42 is disposed at the surface side. In case that the transparent protective film 45 is laminated as shown in FIG. 13, it is preferable that the transparent protective film 45 is disposed at the surface side.

To manufacture the solar battery of the present invention using the covering member for solar battery as mentioned above, the covering member of the present invention is used for sealing solar cells, instead of the conventional glass plate for solar battery shown in FIG. 17. It is preferable that the covering member of the present invention is previously integrally laminated to a sealing EVA film.

As shown in FIG. 15, the covering/sealing film 46 of the present invention comprises a covering member 41A of the present invention (a covering member 41 or a covering member 41B may also be employed) and an EVA film 47 integrally laminated to the covering member 41A.

The covering/sealing film 46 for solar battery can be easily manufactured by integrally laminating the covering member 41A of the present invention onto the EVA film 47 in forming the EVA film 47. In this case, the temperature for laminating is suitably in a range from 75° C. to 90° C.

The thickness of the EVA film 47 is preferably in a range from 0.1 mm to 1 mm.

The solar battery 40 of the present invention can be easily manufactured by integrally laminating the covering/sealing film 46 for solar battery onto a backside covering member 17, an EVA film 18, and solar cells such as silicon photovoltaic elements 19 together as shown in FIG. 16 according to the normal method, i.e. by deaerating, pressing, and heating the stack with a vacuum laminator at a temperature of 120–150° C., with a time period for deaerating 2–15 minutes, at a pressure of 0.5–1 atm, and a time period for pressing 8–45 minutes.

Description will now be made as regard to EVA resin component suitably used as a material of the EVA film and the ultraviolet absorbing EVA adhesive film used in the solar battery of the present invention.

According to the present invention, a cross-linking agent is added in the EVA resin component to have cross-linked structure for improving the weatherability. An organic peroxide which produces a radical at a temperature equal to or more than 100° C. is generally used as this cross-linking agent. More particularly, an organic peroxide having decomposition temperature equal to or more than 70° C. for a half life of 10 hours is preferably used in view of the stability when mixed. Specific examples used as the organic peroxide are 2,5-dimethylhexane; 2,5-dihydroperoxide; 2,5-dimethyl-2,5-di-(t-butylperoxy)hexane; 3-di-t-butylperoxide; t-dicumyl peroxide; 2,5-dimethyl-2,5-di(t-butylperoxy)hexyne; dicumyl peroxide; α, α'-bis (t-butyl peroxy isopropyl)benzene; n-butyl-4,4-bis (t-butyl-peroxy) butane; 2,2-bis (t-butyl-peroxy)-butane, 1,1-bis (t-butyl-peroxy)cyclohexane; 1,1-bis (t-butyl-peroxy)-3,3,5-trimethylcyclohexane; t-butyl peroxy benzoate; and benzoyl peroxide. The content of the organic peroxide is generally 5 parts by weight or less, preferably 1–3 parts by weight, relative to 100 parts by weight of EVA resin.

In order to increase the adhesive strength to the photovoltaic elements when used as the sealing layer for solar battery or to increase the adhesive strength to bond the films when used as the adhesive sheet, the EVA resin may contain silane coupling agent. Used as the silane coupling agent for this purpose may be one known in the art, for example, γ-chloropropyl trimethoxy silane; vinyltrichlorosilane; vinyltriethoxysilane; vinyl-tris (β-methoxyethoxy) silane; γ-methacryloxypropyl trimethoxy silane; β-(3,4-ethoxycyclohexyl) ethyl trimethoxy silane; γ-glycidoxypropyltrimethoxysilane; vinyltriacetoxy silane; γ-mercaptopropyl trimethoxy silane; γ-aminopropyl trimethoxy silane; and N-β-(aminoethyl)-γ-aminopropyl trimethoxy silane. The content of the silane coupling agent is generally 5 parts by weight or less, preferably 0.1–2 parts by weight, relative to 100 parts by weight of EVA resin.

In order to increase the gel rate of the EVA resin and improve the durability, a crosslinking assistant may be added to the EVA. Specific examples of the crosslinking assistant for this purpose are trifunctional crosslinking assistants such as triallyl isocyanurate; triallyl isocyanate, and monofunctional crosslinking assistants such as NK ester, which are known in the art. The content of the crosslinking assistant is generally 10 parts by weight or less, preferably 1–5 parts by weight, relative to 100 parts by weight of EVA resin.

In order to improve the stability of the EVA resin, hydroquinone; hydroquinone monomethyl ether; p-benzoquinone; and/or methyl hydroquinone may be added. The content of such additive is generally 5 parts by weight or less relative to 100 parts by weight of EVA resin.

If necessary, in addition to the aforementioned additives, coloring agent, ultraviolet absorbing agent, antioxidant, and/or anti-discoloration agent may be added. The coloring agent is exemplified by inorganic pigments such as metallic oxide and metal powder, organic pigments such as lake pigments of azo group, phthalocyanine group, azi group, acid dye group, and basic dye group. The ultraviolet absorbing agent is exemplified by benzophenone series compounds including 2-hydroxy-4-octoxybenzophenone and 2-hydroxy-4-methoxy-5-sulfobenzophenone, benzotriazole series compounds including 2-(2'-hydroxy-5-methylphenyl)-benzotriazole, and salicylate compounds including phenyl salicylate and p-t-butylphenyl salicylate. The antioxidant is exemplified by amine series compounds, phenol series compounds, bisphenyl series compound, and hindered amine series compounds. Specific examples are di-t-butyl-p-cresole and bis (2,2,6,6-tetramethyl-4-piperazil) sebacate.

Industrial Applicability

As described above, the covering member for solar battery of the present invention is a transparent resin film which is excellent both in moistureproof property and sunproof property. Therefore, by employing this covering member as a transparent protective member for solar battery, a solar battery can be provided which is flexible for the configuration, is lightweight and excellent in impact resistance, and which can be prevented from deterioration due to ultraviolet radiation and can be prevented from corrosion, thus excellent in the durability.

The covering/sealing film for solar battery of the present invention is manufactured by integrally laminating the above covering member and an EVA film. Therefore, by employing the covering/sealing film, a high-performance solar battery which is lightweight and excellent in impact resistance and durability can be effectively manufactured with excellent workability.

The solar battery of the present invention employs the covering member of the present invention as front side and/or back side protective members and thus is flexible for the configuration, lightweight, and excellent in impact resistance and durability.

What is claimed is:

1. A covering member for solar battery, to be used as a transparent protective member for protecting solar cells of a solar battery, comprising:

a transparent high-sunproof film, a transparent high-moistureproof film laminated on the transparent high-sunproof film and formed of two transparent polyethylene terephthalate films and inorganic oxide coatings coated on the respective two films, said inorganic oxide coatings being formed of at least one material selected from the group consisting of silica and alumina, and having coating surfaces bonded to each other, and ethylene-vinyl acetate copolymer adhesive disposed between said transparent high-sunproof film and said transparent high-moistureproof film for integrally connecting the same, said ethylene-vinyl acetate copolymer adhesive containing ultraviolet absorbing agent and organic peroxide as a cross-linking agent.

2. A covering member for solar battery as claimed in claim 1, wherein said transparent high-sunproof film is a fluororesin film.

3. A covering member for solar battery as claimed in claim 2, wherein said fluororesin film is made of fluororesin which is at least one material selected from the group consisting of polytetrafluoroethylene, 4-fluoroetylene-perchloroalkoxy-copolymer, 4-fluoroethylene-6-fluoropropylene-copolymer, 2-ethylene-4- fluoroethylene-copolymer, polychloro-3-fluoroethylene, polyvinylidene fluoride, and polyvinyl fluoride.

4. A covering member for solar battery as claimed in claims 1, wherein said transparent high-sunproof film is made of a resin composition made by mixing ultraviolet absorbing agent into at least one material selected from the group consisting of acrylic resin, polycarbonate resin, polyethylene terephthalate resin, and polyethyleneaphthalate resin.

* * * * *